US012601795B2

(12) United States Patent
Timopheev et al.

(10) Patent No.: US 12,601,795 B2
(45) Date of Patent: Apr. 14, 2026

(54) MAGNETIC SENSOR ELEMENT, SENSING DEVICE AND SENSING OPERATION USING THE SENSING DEVICE FOR SENSING AN EXTERNAL MAGNETIC FIELD WITH LOW-NOISE

(71) Applicant: Allegro MicroSystems, LLC, Manchester, NH (US)

(72) Inventors: Andrey Timopheev, Vif (FR); Ali Alaoui, Polienas (FR); Nikita Strelkov, Meylan (FR)

(73) Assignee: Allegro MicroSystems, LLC, Manchester, NH (US)

( * ) Notice: Subject to any disclaimer, the term of this patent is extended or adjusted under 35 U.S.C. 154(b) by 204 days.

(21) Appl. No.: 18/650,615

(22) Filed: Apr. 30, 2024

(65) Prior Publication Data

US 2025/0334654 A1      Oct. 30, 2025

(51) Int. Cl.
*G01R 33/09*          (2006.01)
(52) U.S. Cl.
CPC ......... *G01R 33/098* (2013.01); *G01R 33/091* (2013.01)
(58) Field of Classification Search
CPC ........................... G01R 33/098; G01R 33/091
See application file for complete search history.

(56) References Cited

U.S. PATENT DOCUMENTS

| | | | |
|---|---|---|---|
| 9,529,060 B2 | 12/2016 | Fermon et al. | |
| 9,804,234 B2 | 10/2017 | Dressler et al. | |
| 11,605,670 B2 * | 3/2023 | Luo | ..................... G11C 11/1693 |
| 12,000,870 B2 | 6/2024 | Jaiswal et al. | |
| 2014/0056061 A1 * | 2/2014 | Khvalkovskiy | ....... H01F 41/325 |
| | | | 365/158 |
| 2019/0189176 A1 | 6/2019 | Chia et al. | |
| 2023/0126694 A1 | 4/2023 | Agrawal et al. | |

OTHER PUBLICATIONS

U.S. Appl. No. 18/470,538, filed Sep. 20, 2023, Solignac et al.
Luo et al., "Implementation of a Full Wheatstone-Bridge GMS Sensor by Utilizing Spin-Orbit Torque Induced Magnetization Switching in Synthetic Antiferromagnetic Layer;" Article from Journal of Applied Physics, vol. 133, 153902; Published Online Apr. 17, 2023; 8 Pages.
PCT International Search Report and Written Opinion dated Jul. 22, 2025 for International Application No. PCT/US2025/013928; 19 Pages.

* cited by examiner

*Primary Examiner* — Alesa Allgood
(74) *Attorney, Agent, or Firm* — DALY, CROWLEY, MOFFORD & DURKEE, LLP

(57)          ABSTRACT

A magnetic sensor element is disclosed, comprising a magnetic tunnel junction (MTJ) comprising a reference layer, a tunnel barrier layer, a sense layer having a sense magnetization freely orientable in the presence of the external magnetic field. The reference layer has a reference magnetization and comprises a reference SAF structure and an in-plane sensitivity axis. A SOT electrode configured to pass a SOT current adapted to switch the first reference magnetization in two opposed directions along the sensitivity axis by a spin orbit torque interaction. Also disclosed is a sensing device comprising at least one sensing branch including at least one magnetic sensor element and a sensing operation using the sensing device for sensing an external magnetic field. The magnetic sensor element allows for sensing the external magnetic field with low 1/f noise.

13 Claims, 10 Drawing Sheets

MAGNETIC SENSOR ELEMENT, SENSING DEVICE AND SENSING OPERATION USING THE SENSING DEVICE FOR SENSING AN EXTERNAL MAGNETIC FIELD WITH LOW-NOISE

FIELD

The present disclosure concerns a magnetic sensor element and a sensing device for sensing an external magnetic field. The present disclosure further concerns a sensing operation for sensing a direction and amplitude of an external magnetic field, using the sensing device.

BACKGROUND

A tunnel magnetoresistance (TMR)-based sensor has high sensitivity and therefore is suitable for sensing an external magnetic field. A TMR-based sensor is also less demanding to the quality of a signal conditioning circuitry. However, pink noise (1/f noise) is often dominating in TMR sensor and limits its magnetic detectivity at low frequencies. A TMR-based sensor is often used in a full bridge configuration.

It has been shown that modulation of the bias voltage applied in a TMR-based sensor in a full bridge configuration does improve the sensor detectivity when sensing an external magnetic field (assuming that noise from signal conditioning circuitry does not contribute significantly). The reason is that 1/f noise in the TMR-based sensor originates from random fluctuation of resistance in each sensing branch (comprising a TMR sensing element) of the full bridge. The 1/f noise is electrically unrecognizable from the resistance variation in each sensing branch in the presence of the external magnetic field.

The 1/f noise in the TMR-based sensor can be decreased by increasing the sensor size. However, this results in higher die cost and a lower spatial resolution of the sensor. The 1/f noise in the TMR-based sensor can also be decreased by varying the physical position of the sensor relative to the local magnetic environment (MEMS-based approach). However, this results in an increased complexity and higher costs in the sensor fabrication. The sensor also requires complex driving electronics.

Another way of decreasing the 1/f noise in the TMR-based sensor comprises modulating a magnetic field in a direction transversal to the external magnetic field sensed by the TMR-based sensor (shaking field approach). This solution can result in reduced linearity of the output signal of the TMR-based sensor and a limited range of the magnetic field that the TM-based sensor can sense. This approach is typically destined for low-field sensing since modulation efficiency decreases with external field. This approach also results in a large footprint of the TMR sensor, more complex packaging and fabrication, and higher costs.

SUMMARY

The present disclosure concerns a magnetic sensor element for sensing an external magnetic field, comprising at least one magnetic tunnel junction (MTJ) comprising, in this order, a reference layer, a tunnel barrier layer, a sense layer, and a capping electrode layer. The sense layer has a sense magnetization that is freely orientable in the presence of the external magnetic field in the plane of the sense layer. The reference layer comprises a reference SAF structure including a first reference sublayer, having a first reference magnetization, a second reference sublayer having a second reference magnetization and separated from the first reference sublayer by a coupling layer antiferromagnetically coupling the first and second reference sublayers. The reference layer has a sensitivity axis in the plane of the reference layer, such that the first and second reference magnetizations are switchable along the sensitivity axis between a first switching direction and a second switching direction opposed to the first switching direction. The magnetic sensor element further comprises a SOT electrode, in direct contact with the first reference sublayer and configured to pass a SOT current adapted to switch the first reference magnetization by a spin orbit torque (SOT) interaction in the first or second switching direction, depending on the direction of the SOT current.

The present disclosure further concerns a sensing device comprising the at least one sensing branch comprising at least one magnetic sensor element.

The present disclosure further concerns a sensing operation for sensing a direction and amplitude of an external magnetic field, using the sensing device.

With respect to what is known in the art, the invention provides the advantage that the magnetic sensor element, sensing device, and a sensing operation that can sense an external magnetic field without pink noise (1/f noise) originating from the fluctuations of the MTJ resistance. When sensing the external magnetic field, the sensing device provides good linearity response and operating magnetic range. The sensing device disclosed herein does not require using a full-bridge architecture since the resistance signal is determined differentially.

These and other advantages will become apparent to those skilled in the relevant art upon a reading of the following descriptions.

BRIEF DESCRIPTION

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Figure 1:
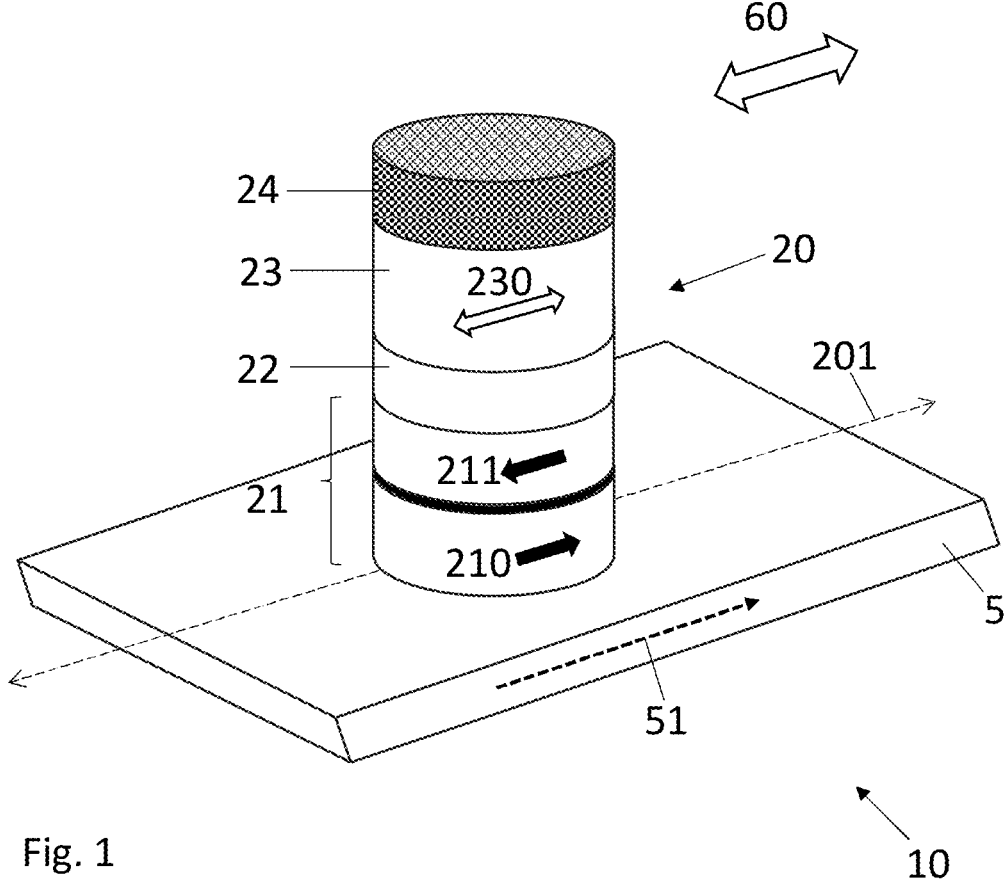
FIG. 1 shows a perspective view of a magnetic sensor element according to an embodiment.

FIG. 1 shows a perspective view of a magnetic sensor element 10 according to an embodiment. The magnetic sensor element 10 comprises a MTJ 20. The MTJ 20 comprises a reference layer 21, a tunnel barrier layer 22, a sense layer 23, and a capping electrode layer 24. The capping electrode layer 24 can comprise an electrically conductive strip or line. Preferably, the reference, tunnel barrier, sense, and capping electrode layers 21-24 are arranged in this order. The sense layer 23 has a sense magnetization 230 that is freely orientable in the presence of the external magnetic field 60 in the plane of the sense layer 23 (in-plane sense magnetization 230).

Figure 2:
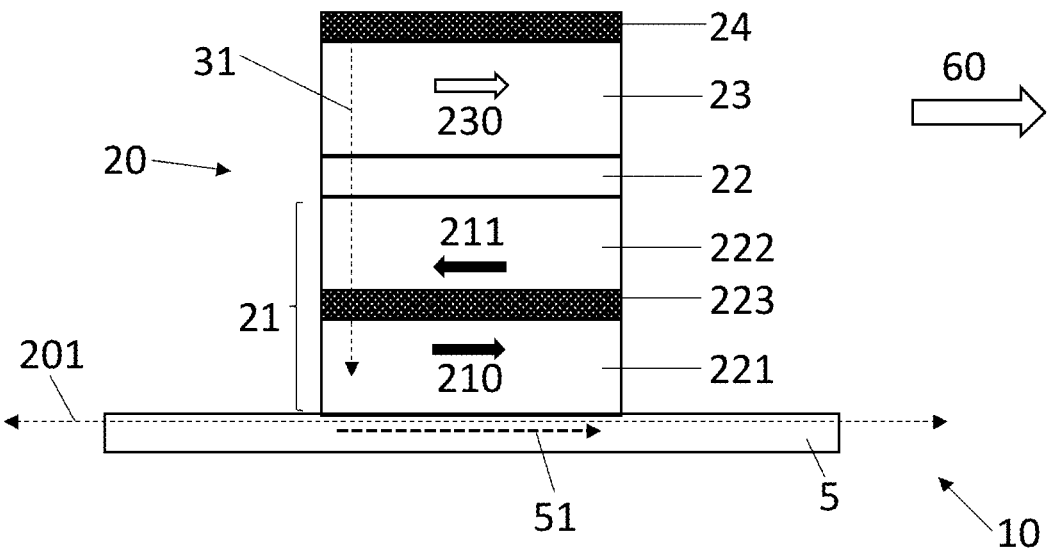
FIG. 2 shows a side view of the magnetic sensor element during a first switching cycle, according to an embodiment.
Figure 3:
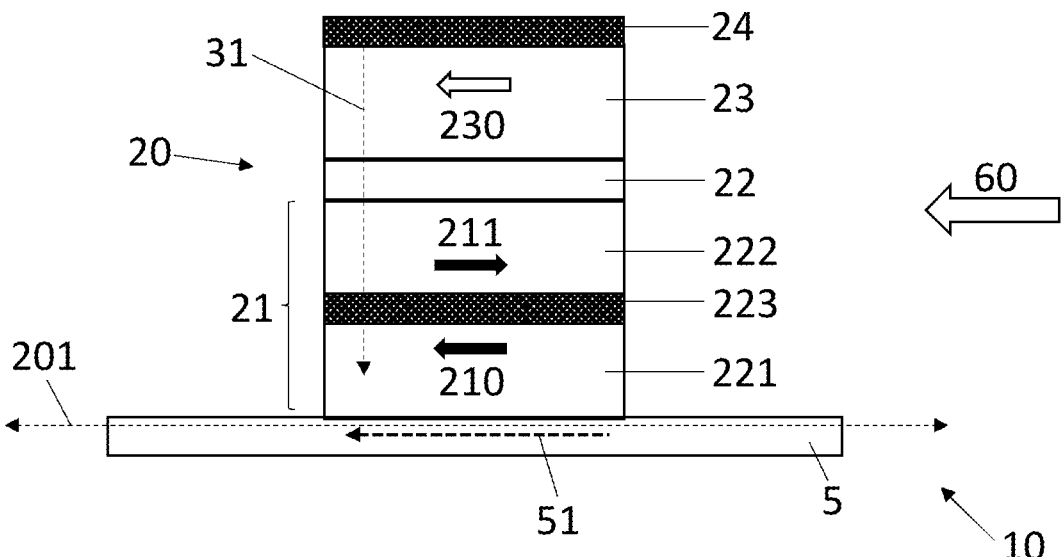
FIG. 3 shows a side view of the magnetic sensor element during a second switching cycle, according to an embodiment.

FIGS. 2 and 3 show a side view of the magnetic sensor element 10. In a preferred embodiment, the reference layer 21 comprises a reference SAF structure including a first reference sublayer 221 having a first reference magnetization 210, a second reference sublayer 222 having a second reference magnetization 211, and a coupling layer 223 between the first and second reference sublayers 221, 222. The second reference sublayer 222 can be in contact with the tunnel barrier layer 22. The coupling layer 223 is configured to produces an antiferromagnetically coupling (a RKKY coupling) between the first and second reference magnetization 210, 211 such that the second reference magnetization 211 remains antiparallel to the first reference magnetization 210.

As illustrated in FIGS. 1 to 3, the magnetic sensor element 10 further comprises a SOT electrode 5 in direct contact with the first reference sublayer 221. The SOT electrode 5 is configured to pass a SOT current 51 adapted to switch the first reference magnetization 210 by a SOT interaction in the first or second switching direction, depending on the direction of the SOT current 51. The SOT electrode 5 can include a metal with high degree of spin orbit coupling. A metal with a high degree of spin-orbit coupling can inject a large spin polarized current into the reference layer 21. The large spin polarized current can exert a large amount of torque and switch the reference magnetization 210 in direct contact with the SOT electrode 5. Switching the first reference magnetization 210 by SOT interaction is an interface effect and does not require passing a current through the MTJ 20.

Switching the first reference magnetization 210 in the first or second switching direction results the second reference magnetization 211 to be switched in the corresponding opposed direction (antiparallel to the first reference magnetization 210) due to the antiferromagnetically coupling of the coupling layer 223.

In an embodiment, the SOT electrode 5 includes a metal such as but not limited to tantalum, tungsten, platinum, or gadolinium. In an embodiment, the SOT electrode 5 includes a beta phase tantalum or beta phase tungsten. The SOT electrode 5 that includes a beta phase tantalum or beta phase tungsten has a high spin hall efficiency and can generate a large spin hall current for a given charge current that is passed through the SOT electrode 5. The SOT electrode 5 can comprise a multilayer stack including one or more layers of metals such as but not limited to tantalum, tungsten, platinum, or gadolinium. In the case the SOT electrode 5 includes a multilayer stack, the layer with the highest degree of spin-orbit coupling can be disposed directly adjacent to the reference layer 21. In an embodiment, the SOT electrode 5 has thickness of between 5 nm and 10 nm.

The SOT electrode 5 can comprise an electrically conductive strip or line. The SOT electrode 5 can extend substantially in the plane of the reference layer 21.

As illustrated in FIGS. 1 to 3, the reference layer 21 may have a uniaxial magnetic anisotropy axis in the plane of the reference layer 21 (so called sensitivity axis 201 thereafter). The uniaxial magnetic anisotropy can have a magnitude of up to several hundreds of Oe (several thousand of A/m). In this configuration, the first and second reference magnetizations 210, 211 are switchable along the sensitivity axis 201 between two stable directions in the plane of the reference layer 21, namely a first switching direction and a second switching direction opposed to the first switching direction. The sensitivity axis 201 corresponds to an easy axis or energetically favorable direction of the reference magnetization 210, 211 in the absence of an external magnetic field of force (such as caused by the SOT interaction when passing the SOT current 51).

The sensitivity axis 201 allows for stabilizing the first and second reference magnetization 210, 211 in two possible opposite directions in the absence of the SOT current 51 passing in the SOT electrode 5. In other words, an angular deviation in the alignment of the direction of the first and second reference magnetization 210, 211 relative to the anisotropy axis 201 is minimized. The sensitivity axis 201 corresponds to the sensitivity axis of the magnetic sensor element 10.

The sensitivity axis 201 of the reference layer 21 can be provided by the geometry of the reference layer 21. For example, the reference layer 21 may have an elliptical shape and the sensitivity axis 201 corresponds to the long axis of the elliptical shape. Alternatively, the sensitivity axis 201 of the reference layer 21 can be provided by the magnetocrystalline or crystal structure of the reference layer 21, or the stress, applied stress, or residual stresses on the reference layer 21. sensitivity axis 201 can be provided by controlling the magnetocrystalline growth direction during the manufacturing of the reference layer 21 of the MTJ 20.

In this configuration, the sense magnetization 230 is subjected to the external magnetic field 60 only and senses its direction and amplitude by changing its orientation in the plane of the sense layer 23. The reference magnetization 210 remains substantially fixed while the sense magnetization 230 is deflected by the external magnetic field 60.

The reference layer 21 and the sense layer 23 can include, or be formed of, a magnetic material and, in particular, a magnetic material of the ferromagnetic type. Suitable ferromagnetic materials include transition metals, rare earth elements, and their alloys, either with or without main group elements. For example, suitable ferromagnetic materials include iron (Fe), cobalt (Co), nickel (Ni), and their alloys, such as NiFe or CoFe alloys; alloys based on Ni, Fe, and boron (B) and alloys based on Co, Fe, and B. In some instances, alloys based on Ni and Fe (and optionally B) can have a smaller coercivity than alloys based on Co and Fe (and optionally B).

Each of the first and second reference sublayers 221, 222 can comprise a CoFe, CoFeB or NiFe alloy and have a thickness typically comprised between about 0.5 nm and about 4 nm. The coupling layer 223 can comprise a non-magnetic material selected from a group comprising at least one of: ruthenium, chromium, rhenium, iridium, rhodium, silver, copper, and yttrium. Preferably, the coupling layer 232 comprises ruthenium and has a thickness typically included between about 0.4 nm and 2 nm, preferably between 0.6 nm and about 0.9 nm or between about 1.6 nm and about 2 nm.

The tunnel barrier layer 22 can comprise, or be formed of, an insulating material. Suitable insulating materials include oxides, such as aluminum oxide (e.g., $Al_2O_3$) and magnesium oxide (e.g., MgO). The thickness of the tunnel barrier layer 22 can be in the nm range, such as from about 1 nm to about 3 nm. An optimal thickness of the tunnel barrier 22 can be obtained by inserting a plurality (double or multilayer) of MgO (or another suitable oxide or insulating material) layers. The tunnel barrier layer 22 can be configured to provide high TMR, for example above 80 percent.

In a preferred embodiment, the reference SAF structure of the reference layer 21 is compensated such that the macroscopic magnetization (magnetic moment) of the reference layer 21 is substantially null in the absence of an external magnetic field 60. The compensated reference SAF structure can be obtained by adjusting the thickness of the first and second reference sublayers 221, 222. The magnetic response of the reference layer 21 having a compensated reference SAF structure is not affected by the external magnetic field 60 and by a magnetic field (Oersted field) generated by the current 51 passing in the SOT electrode 5.

A sensing operation using the magnetic sensor element 10 is illustrated in FIGS. 2 and 3. According to an embodiment, the sensing operation comprises passing the SOT current 51 in the SOT electrode 5 with a first direction to switch the first reference magnetization 210 of the first reference sublayer 221 in a first switching direction (first switching cycle, see FIG. 2). Due to the antiferromagnetically coupling of the coupling layer 223, the second reference magnetization 211 of the second reference sublayer 221 is oriented antiparallel to the first reference magnetization 210. According to an embodiment, the sensing operation further comprises passing the SOT current 51 in the SOT electrode 5 with a second direction to switch the first reference magnetization 210 of the first reference sublayer 221 in a second switching direction opposed to the first switching direction (second switching cycle, see FIG. 3). Due to the antiferromagnetically coupling of the coupling layer 223, the second reference magnetization 211 of the second reference sublayer 221 is oriented antiparallel to the first reference magnetization 210.

In the presence of an external magnetic field 60, the sense magnetization 230 is deflected in accordance with the direction of the external magnetic field 60 and may have a non-zero magnetization component along the sensitivity axis 201. The resistance of the MTJ 20 depends on the relative orientation between the sense magnetization 230 and the magnetization of the reference layer 21. In particular, the relative orientation between the sense magnetization 230 and the second reference magnetization 211 of the second reference sublayer 221 that is oriented antiparallel to the first reference magnetization 210. For example, the resistance of the MTJ 20 is maximal when the sense magnetization 230 is antiparallel to the second reference magnetization 211 and is minimal when the sense magnetization 230 is parallel to the second reference magnetization 211.

Switching the first reference magnetization 210 between the first and second switching directions results in a change in the resistance of the MTJ 20. According to an embodiment, the sensing operation further comprises passing a read current 31 through the MTJ 20 when the first reference magnetization 210 is in the first switching direction, such as to measure a first resistance R1 of the MTJ 20. The sensing operation further comprises passing a read current 31 through the MTJ 20 when the first reference magnetization 210 is in the second switching direction, such as to measure a second resistance R2 of the MTJ 20. The sensing operation further comprises determining a differential resistance ΔR of the MTJ 20 by the difference between the first resistance and the second resistance.

Since the sense magnetization 230 remains subjected to the external magnetic field 60 only, the differential resistance ΔR corresponds to a measure of the direction and intensity of the external magnetic field 60.

The SOT current 51 can be passed in the SOT electrode 5 as a pulse current having alternating direction.

An advantage of the sensing operation is that the determined differential resistance ΔR is not affected by a possible resistance offset of the MTJ 20 due to thermal drift or/and due to 1/f noise. Indeed, the resistance offset is cancelled by the difference between the first resistance and the second resistance. Resistance offset due to thermal drift of the MTJ resistance can also be eliminated by determining the differential resistance ΔR.

An advantage of the MTJ 20 is that it does not require an antiferromagnetic (AFM) layer to pin the reference magnetization and the reference layer 21 does not need to be programmed (such that the reference magnetization 210 is in a predetermined orientation).

Figure 4:
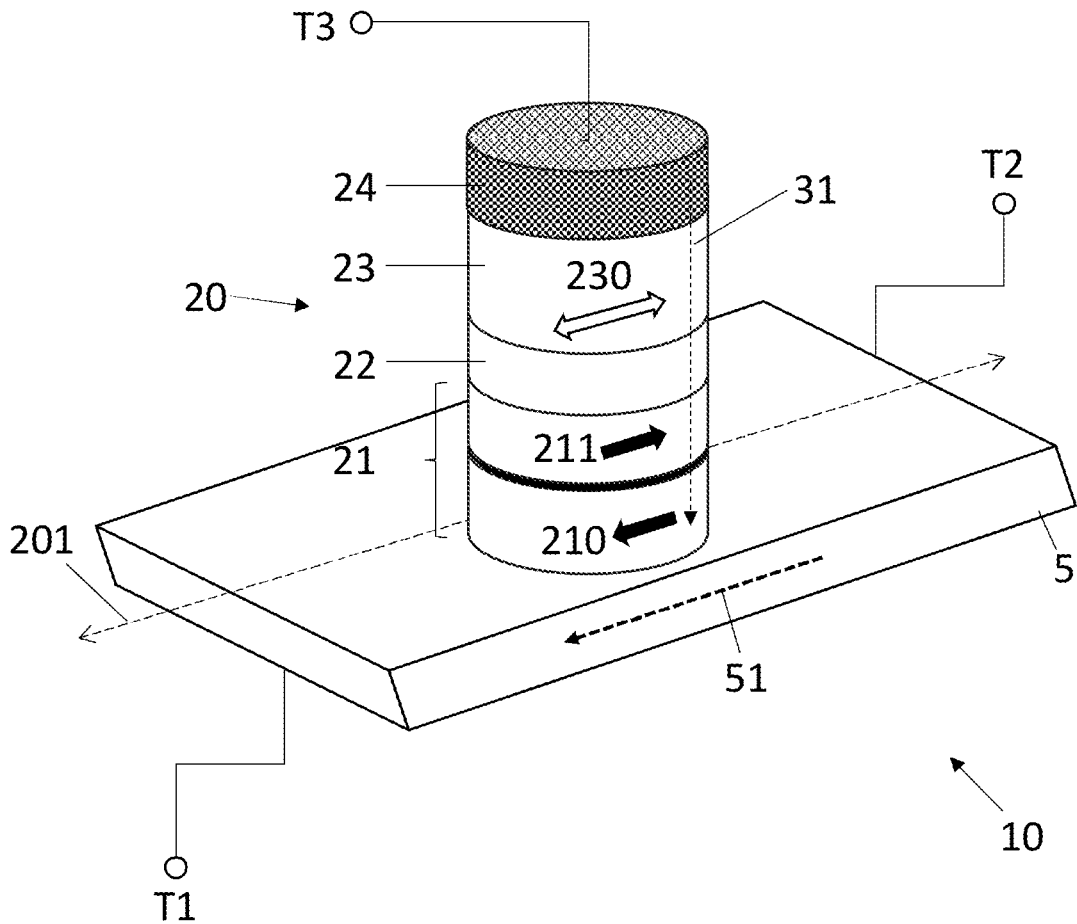
FIG. 4 illustrates the magnetic sensor element in a three-terminal configuration, according to an embodiment.

FIG. 4 illustrates the magnetic sensor element 10 in a three-terminal configuration. In this configuration, the SOT electrode 5 is connected at each of its extremities to a first and second terminal T1, T2. During the sensing operation, the SOT current 51 is passed in the SOT electrode 5 (for example by applying a voltage difference between the first and second terminal T1, T2) to switch the first reference magnetization 210. A third terminal T3 is connected to the MTJ 20 on the side of the sense layer 23 via the capping electrode layer 24. During the sensing operation, the read current 31 is passed (for example by applying a voltage difference) between the third terminal T3 and either ones of the first and second terminals T1, T2. The read current 31 flowing through the MTJ 20 allows for measuring the resistance of the MTJ 20.

Figure 5:
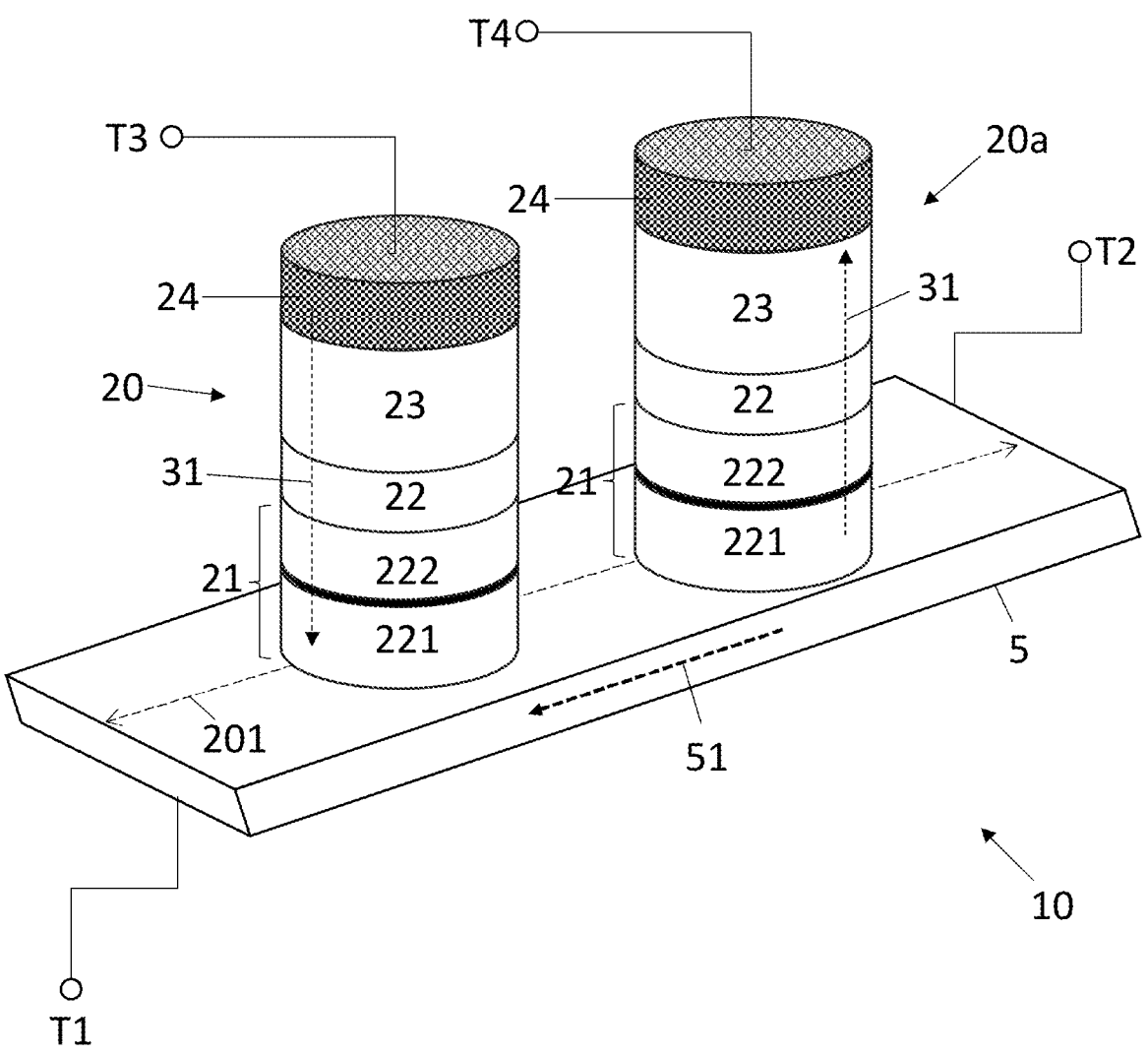
FIG. 5 illustrates the magnetic sensor element in a four-terminal configuration, according to an embodiment.

FIG. 5 illustrates the magnetic sensor element 10 in a four-terminal configuration. The magnetic sensor element 10 comprises a first MTJ 20 and a second MTJ 20a. The first and second MTJs 20, 20a are connected at one end (on the side of the reference layer 21) to the SOT electrode 5. The first MTJ 20 is connected via the capping electrode layer 24 to a third terminal T3 and the second MTJ 20a is connected via the capping electrode layer 24 to a fourth terminal T4. The SOT electrode 5 is connected at each of its extremities to a first and second terminal T1, T2, such that the SOT current 51 can be passed in the SOT electrode 5 (for example by applying a voltage difference between the first and second terminal T1, T2). During the sensing operation, the SOT current 51 is passed in the SOT electrode 5 (for example by applying a voltage difference between the first and second terminal T1, T2) to switch the first reference magnetization 210 of the two MTJs 20. The read current 31 is passed (for example by applying a voltage difference) between the third terminal T3 and the fourth terminal T4 and either ones, or both, of the first and second terminals T1, T2. The read current 31 flowing through the first and second MTJs 20, 20a allows for measuring the resistance of the first and second MTJ 20, 20a, respectively. The read current 31 can be passed through the first and second MTJs 20, 20a simultaneously or alternatively.

The three- and four-terminal configurations allow for separating the path of the SOT current 51 from the path of the read current 31. Since the SOT current 51 does not flow through the MTJ 20 the latter experiences less stress.

In an embodiment, a sensing device may comprise at least a sensing branch including one or a plurality of the magnetic sensor element 10. The magnetic sensor element 10 can be configured in a three- or four-terminal configuration. The sensing device can comprise a controller configured to control the sensing operation in the sensing branch. More particularly, the controller can be configured to control the passing of the SOT current 51 in the SOT electrode 5 and the passing of the read current 31 through the MTJ 20, 20a.

In some embodiments, the sensing device 100 comprises a plurality of sensing branches 110 comprising a plurality of magnetic sensor elements 10 (see FIGS. 6 to 10). The sensing device 100 further comprises a SOT line driver 30 configured to control the passing of the SOT current 51 in the SOT electrode 5 of the sensing branch 110. The sensing device 100 further comprises a reading circuit 39 configured to control the passing of the read current 31 through the MTJ 20 of the magnetic sensor element 10 in the sensing branch 110. The reading circuit 39 can comprise a current source.

Figure 6:
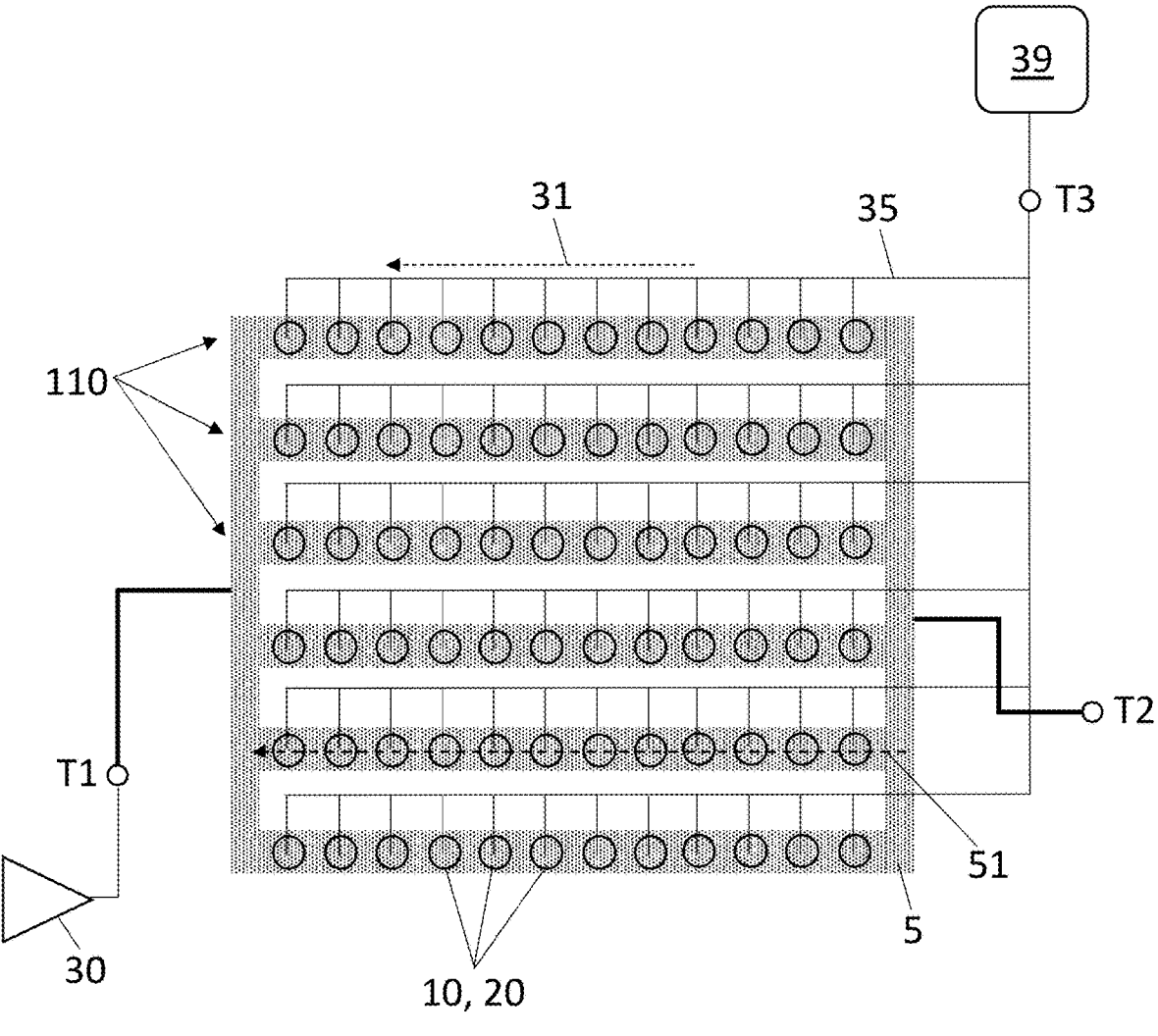
FIG. 6 shows a sensing device according to an embodiment.

FIG. 6 shows a sensing device 100 according to an embodiment. The sensing device 100 comprises a plurality of sensing branches 110, each sensing branch 110 including a plurality of magnetic sensor elements 10. The sensing device 100 further comprises a controller comprising a SOT line driver 30 configured to control the passing of the SOT current 51 in the SOT electrode 5 of each sensing branch 110. The sensing device 100 further comprises a reading circuit 39 configured to control the passing of the read current 31 through the MTJ 20, 20a of each sensing branch 110. In the optional illustrated configuration, the sensing branches 110 are arranged substantially parallel with each other.

In the configuration of FIG. 6, each magnetic sensor element 10 is in a three-terminal configuration and comprises one MTJ 20 connected to a third terminal T3 via the capping electrode layer 24 and a read current line 35. The sensing branches 110 are connected at both ends to a first and second terminal T1, T2. The SOT line driver 30 is connected to one of the first or second terminal T1, T2 such as to control the passing of the SOT current 51 in the SOT electrode 5 of each branch 110. For each branch 110, the SOT electrode 5 extends along the branch 110 and is connected, at each ends of the branch 110, to the first and second terminal T1, T2.

The reading circuit 39 is configured to control the passing of the read current 31 through the MTJs 20, between the third terminal T3 and one of, or both, the first and second terminals T1, T2.

The controller can be further configured to shorten the first and second terminals T1, T2 during the passing of the read current 31. The controller can be further configured to avoid the read current 31 shortening and/or biasing through the SOT electrodes 5. The controller can be further configured to such that passing of the SOT current 51 in the SOT electrode 5 does not overlap the passing of the read current 31 through the MTJs 20.

The differential resistance ΔR is measured by passing the read current 31 between the first and third terminals T1, T3, or between the first and second terminals T1, T2, or between the third terminal T3 and the first and second terminals T1, T2 that are shortened during the passing the read current 31.

Figure 7:
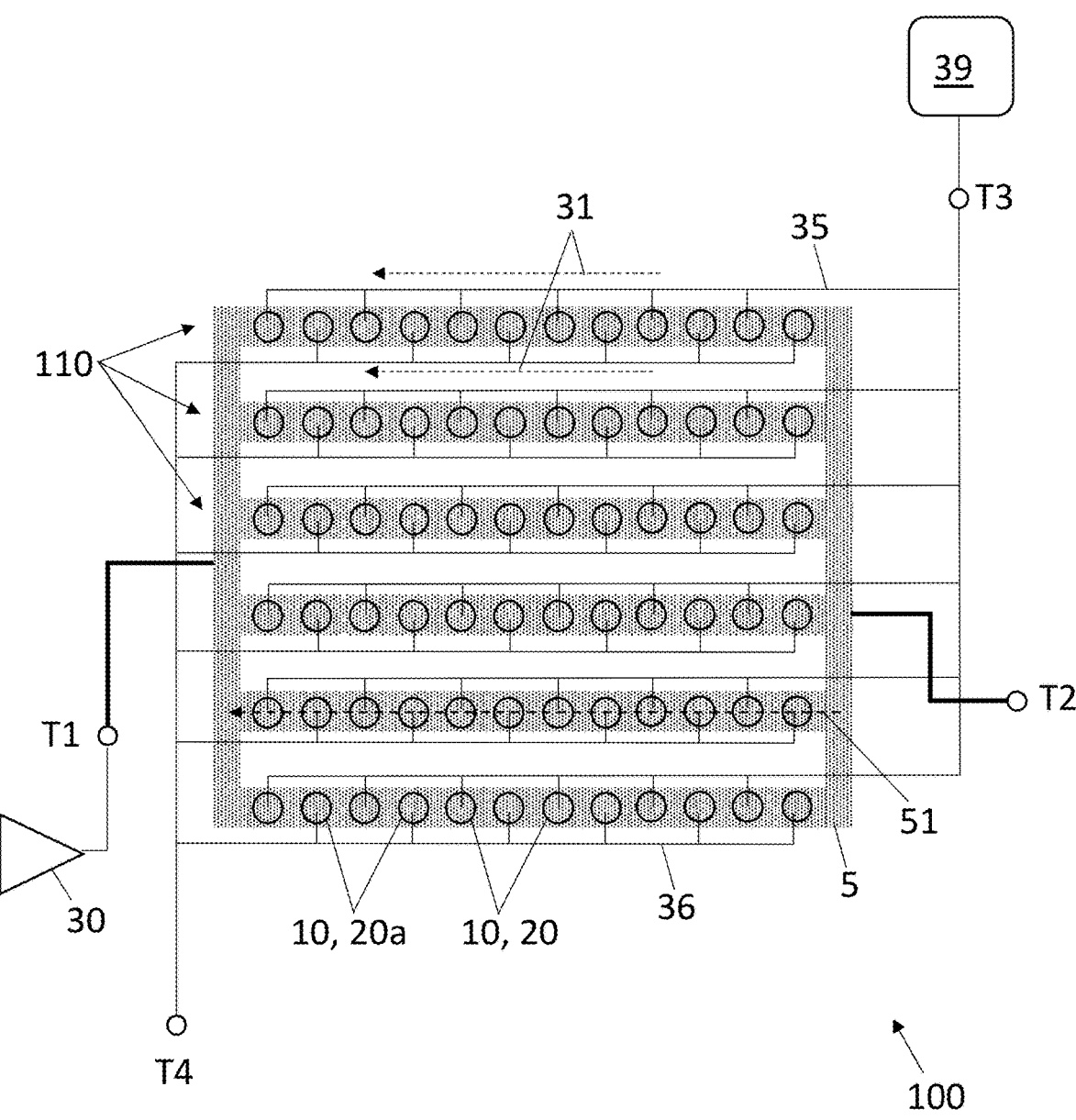
FIG. 7 shows a variant of the sensing device of FIG. 6.

FIG. 7 shows a variant of the sensing device 100 of FIG. 6, wherein the magnetic sensor element 10 is in the fourth terminal configuration wherein the first MTJ 20 is connected via the capping electrode layer 24 and a first read current line

35 to a third terminal T3 and the second MTJ 20a is connected via the capping electrode layer 24 and a second read current line 36 to a fourth terminal T4. In the example of FIG. 7, each adjacent first and second MTJ 20, 20a along one SOT electrode 5 is alternatively connected to the third terminal T3 and the fourth terminal T4. The reading circuit 39 is configured to control the passing of a read current 31 through the first MTJ 20, between the third terminal T3 and one of, or both, the first and second terminals T1, T2. The reading circuit 39 is further configured to control the passing of a read current 31 through the second MTJ 20a, between the fourth terminal T3 and one of, or both, the first and second terminals T1, T2. The sensing device 100 shown in FIG. 7 has increased symmetry and robustness.

The differential resistance ΔR is measured by passing the read current 31 between the first and third terminals T1, T3, or between the first and second terminals T1, T2, or between the third terminal T3 and the first and second terminals T1, T2 that are shortened during the passing the read current 31.

Figure 8:
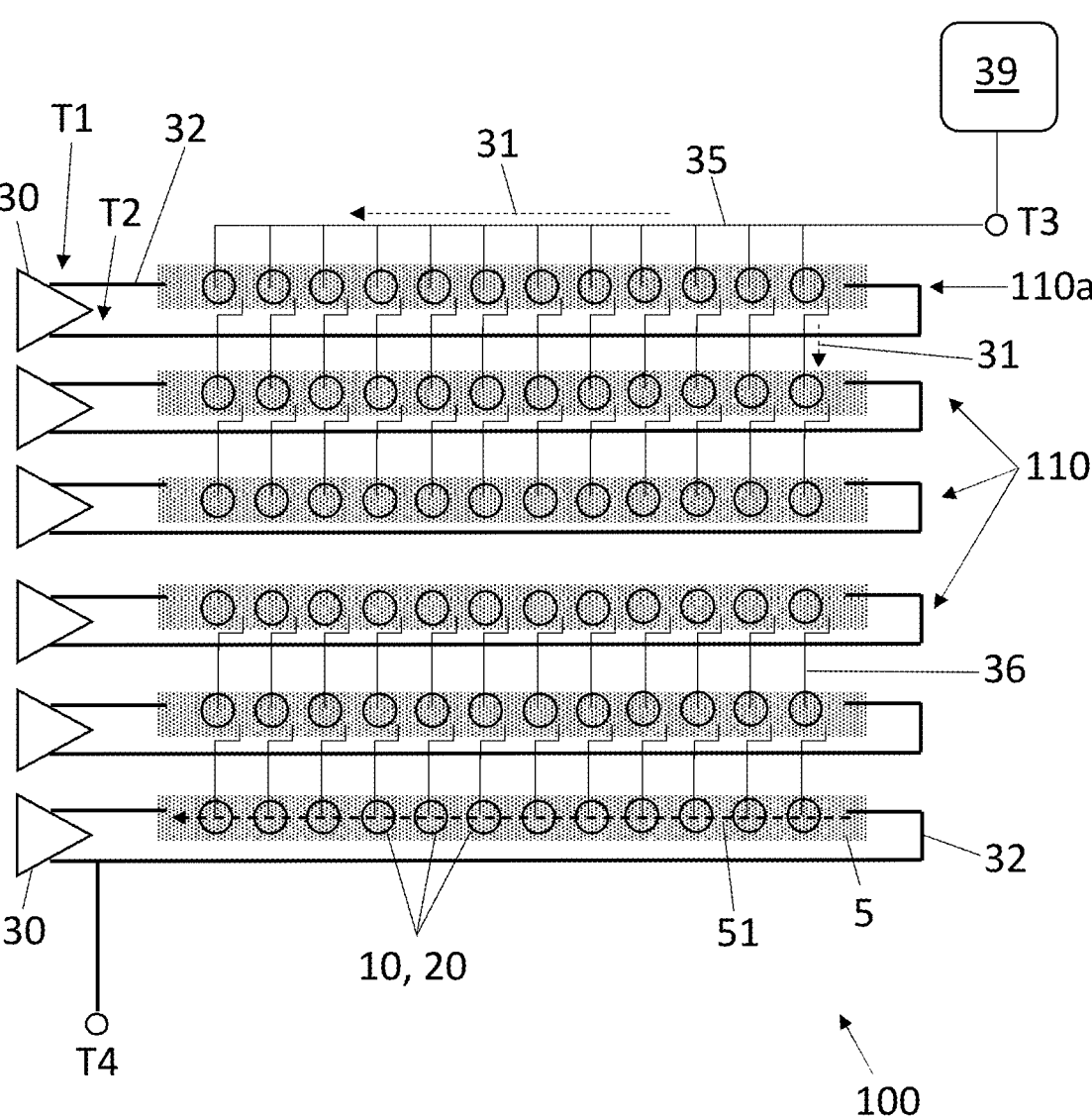
FIG. 8 shows the sensing device according to another embodiment.

FIG. 8 shows the sensing device 100 according to another embodiment. The sensing device 100 comprises a plurality of sensing branches 110, each sensing branch 110 including a plurality of magnetic sensor elements 10. The controller comprises a plurality of SOT line drivers 30. Each sensing branch 110 is connected to one of the SOT line drivers 30 via a driver current line 32 connected at each of the sensing branch 110 extremities to a first and second terminal T1, T2. Each SOT line driver 30 is configured to control the passing of the SOT current 51 in the SOT electrode 5 of the sensing branch 110 to which it is connected.

In the configuration of FIG. 8, each magnetic sensor element 10 is in a three-terminal configuration and comprises one MTJ 20 connected to a third terminal T3 via the capping electrode layer 24 and a read current line 35. The MTJs 20 of one of the branches 110 (let's call it the first branch 110a) are connected in parallel to the third terminal T3 via a first read current line 35. The MTJs 20 in the first branch 110a are connected in series with one of the MTJs 20 in an adjacent sensing branch 110 (along a line perpendicular to the branches 110, 110a) via the SOT electrode 5 and a second read current line 36. In particular, the second read current line 36 is connected between the SOT electrode 5 of one branch 110, 110a and the capping electrode layer 24 of the MTJ 20 in the adjacent branch 110.

In this configuration, the differential resistance ΔR is measured by passing the read current 31 between the first and fourth terminals T1, T4, through each MTJ 20 and via the SOT line 5.

The ratio Ns/Np of the number of MTJs 20 connected in series Ns and in parallel Np in each sensing branches 110 of the sensing device 100 can be adjusted. The MTJs 20 can be interconnected to form a sensing branch 110 having desired Ns/Np ratio according to design requirements.

Figure 9:
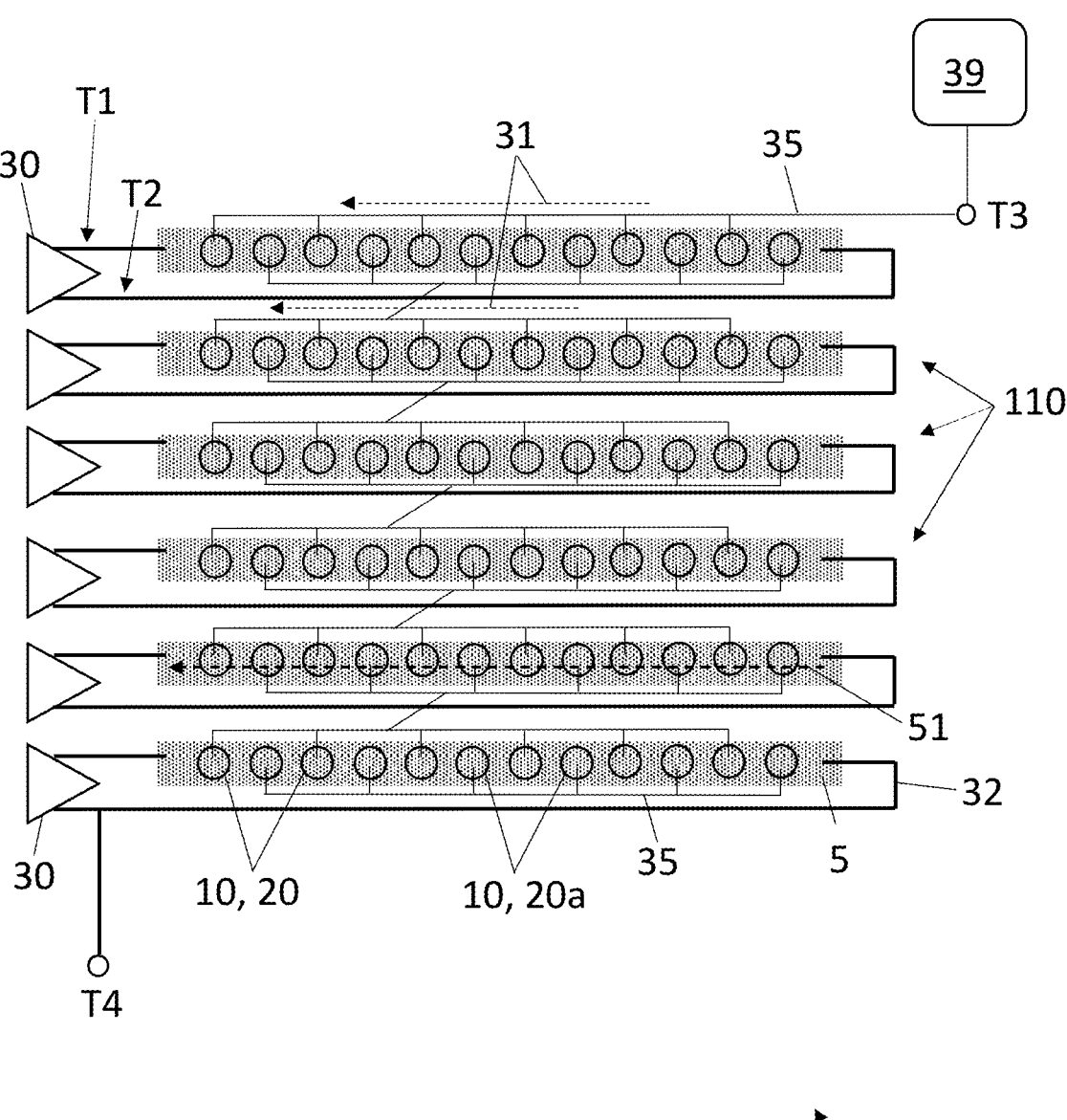
FIG. 9 shows a variant of the sensing device of FIG. 8.

FIG. 9 shows a variant of the sensing device 100 of FIG. 8, wherein each magnetic sensor element 10 is in a four-terminal configuration. Each first MTJ 20 in a sensing branch 110 is connected to the third terminal T3 via a read current line 35, and in series with an adjacent second MTJ 20a in the same sensing branch 110 via the SOT electrode 5. The second MTJs 20a in a sensing branch 110 are connected in series with the first MTJs 20 comprised in an adjacent sensing branch 110 via the read current line 35.

In this configuration, the differential resistance ΔR is measured by passing the read current 31 between the first and fourth terminals T1, T4, through each first and second MTJ 20, 20a and via the SOT line 5. The arrangement of FIG. 9 has increased symmetry.

Figure 10:
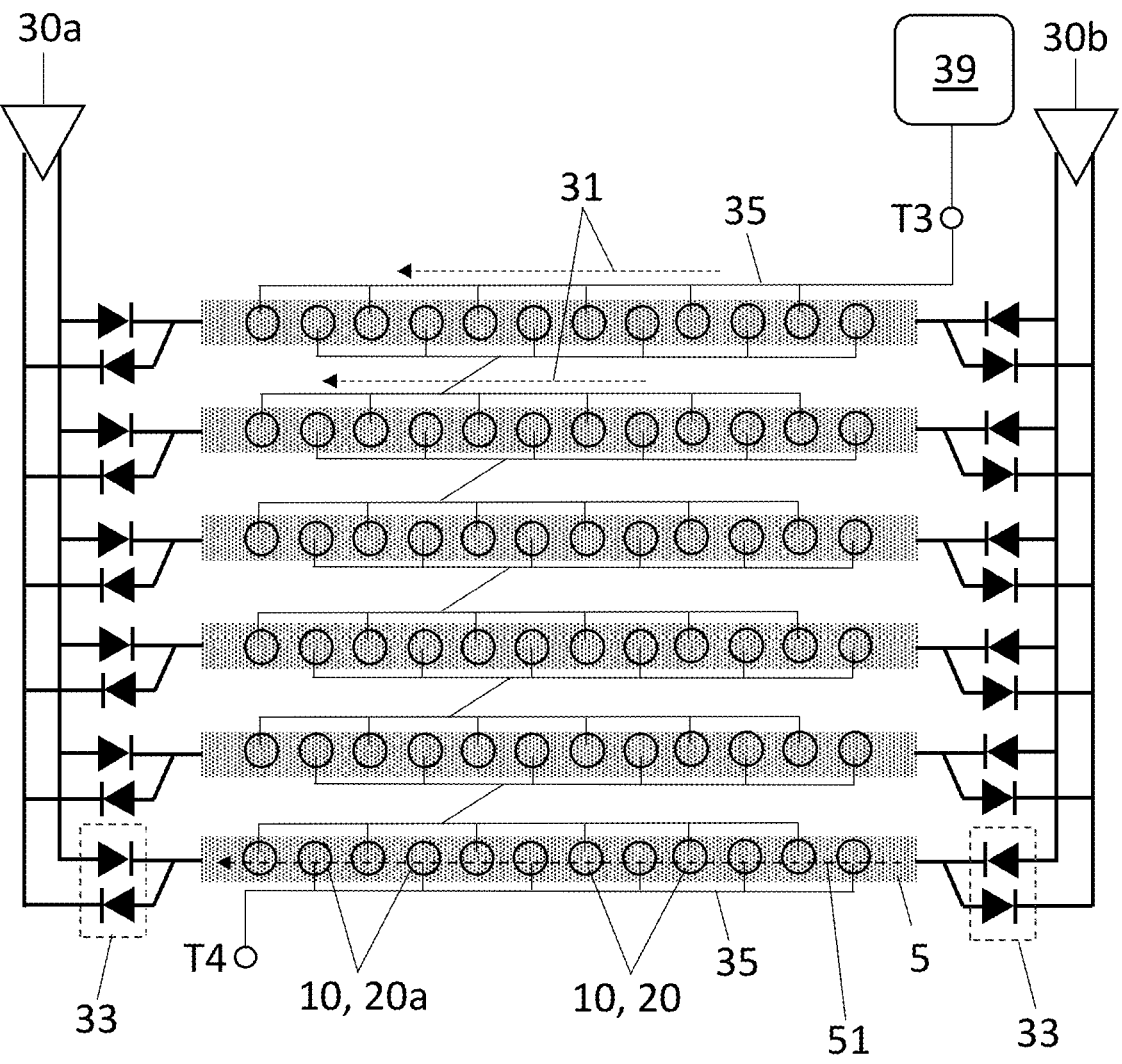
FIG. 10 shows a variant of the sensing device of FIG. 9.

FIG. 10 shows a variant of the sensing device 100 of FIG. 9, where Each sensing branch 110 is connected at both ends to a SOT line drivers 30 via an anti-parallel diode pair 33. The anti-parallel diode pair 33 are configured to prevent the read current 31 from passing from the SOT electrode 5 of a sensing branch 110 to the SOT electrode 5 of another sensing branch 110. In a possible variant, the anti-parallel diode pairs 33 can be replaced by push-pull transistors. In this configuration, the differential resistance $\Delta R$ is measured by passing the read current 31 between the third and fourth terminals T3, T4, through each first and second MTJ 20, 20$a$ and via the SOT line 5.

In general, the SOT line driver 30 can be configured to be galvanically insulated from the SOT electrode 5 when the read current 31 is passed through the MTJs 20, between the third terminal T3 and each MTJ 20. For example, the SOT line driver 30 can have a high-impedance output state during the passing of the read current 31, such as to be galvanically disconnected from the SOT electrode 5, improving reading accuracy.

The SOT line driver 30 can be further configured to pass the SOT current 51 in the two directions along the SOT electrode 5. The SOT line driver 30 can be further configured to pass the SOT current 51 in pulsed mode and in DC mode. In the latter case, the SOT line driver 30 should be galvanically insulated from the SOT electrode 5 when the read current 31 is passed. The controller can be configured such that the passing of the SOT current 51 in the SOT electrode 5 and the passing of the read current 31 through the MTJs 20 are not overlapping.

According to an embodiment, the sensing operation using the sensing device 100, comprising the steps of:

controlling the SOT line driver 30 to perform at least one switching cycle comprising passing the SOT current 51 in the SOT electrode 5 with a first direction to switch the first reference magnetization 210 in a first switching direction and passing the SOT current 51 in the SOT electrode 5 with a second direction to switch the first reference magnetization 210 in a second switching direction opposed to the first switching direction;

for each switching cycle, controlling the reading circuit 39 to pass a read current 31 through the MTJ 20 when the first reference magnetization 210 is in the first switching direction and measure a first resistance R1 of the MTJ 20, and to pass a read current 31 through the MTJ 20 when the first reference magnetization 210 is in the second switching direction and measure a second resistance R2 of the MTJ 20; and for each switching cycle, determining a differential resistance $\Delta R$ from the difference between the first and second resistances R1, R2.

In one aspect, controlling the SOT line driver 30 comprises passing a DC SOT current 51 or a pulsed SOT current 51.

The sensing operation can further comprise a step of galvanically insulating the SOT line driver 30 from the SOT electrode 5 during the controlling the reading circuit 39 (during the passing of the read current 31 through the MTJ 20).

The sensing operation can further comprise a plurality of switching cycles and comprising a step of averaging the determined differential resistance $\Delta R$ over the plurality of switching cycles. The step of averaging can comprise using an averaging filter function configured to compute an average for each differential resistance $\Delta R$ determined over the plurality of switching cycles.

Figure 11:
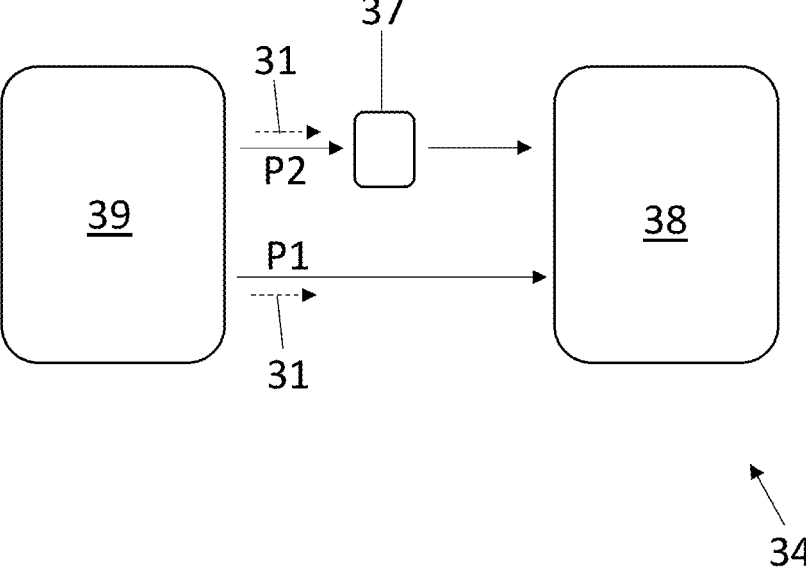
FIG. 11 shows a schematic representation of the controller circuit, according to an embodiment.

For each switching cycle, the measured first resistance R1 can be stored, for example in a sample and hold circuit 37 of the controller. The determination of the differential resistance $\Delta R$ can be performed in a differential amplifier circuit 38 of the controller. FIG. 11 shows a schematic representation of the controller circuit 34, comprising the reading circuit 39, the sample and hold circuit 37, and the differential amplifier circuit 38. Performing the switching cycles comprises passing the read current 31 after the SOT current 51 having the first direction (first switching cycle indicated by P1), storing the first resistance R1 in the sample and hold circuit 37, and passing the read current 31 after the SOT current 51 having the second direction (second switching cycle indicated by P2). The differential resistance $\Delta R$ is determined from the stored first resistance R1 measured during the first switching cycle and the second resistance R2 measured during the second switching cycle.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

REFERENCE NUMBERS AND SYMBOLS 10 magnetic sensor element
100 sensing device
110 sensing branch
110$a$ first branch
20 magnetic tunnel junction (MTJ), first MTJ
20$a$ second MTJ
21 reference layer
201 sensitivity axis
210 reference magnetization, first reference magnetization
211 second reference magnetization
221 first reference sublayer
222 second reference sublayer
223 coupling layer
22 tunnel barrier layer
23 sense layer
230 sense magnetization
24 capping electrode layer
30 SOT line driver
31 read current
32 driver current line
33 anti-parallel diode pair
34 controller circuit
35 read current line, first read current line
36 second read current line
37 sample and hold circuit
38 differential amplifier circuit
39 reading circuit
5 SOT electrode
51 SOT current
R1 first resistance
R2 second resistance ΔR differential resistance
T1 first terminal
T2 second terminal
T3 third terminal
T4 fourth terminal

What is claimed is:

1. A sensing device comprising:
a plurality of sensing branches each comprising at least one magnetic sensor element, said at least one magnetic sensor element comprising:
at least one MTJ comprising, in this order, a reference layer, a tunnel barrier layer, a sense layer, and a capping electrode layer;
wherein the sense layer has a sense magnetization that is freely orientable in the presence of the external magnetic field in the plane of the sense layer;
wherein the reference layer comprises a reference SAF structure including a first reference sublayer, having a first reference magnetization, a second reference sublayer having a second reference magnetization and separated from the first reference sublayer by a coupling layer antiferromagnetically coupling the first and second reference sublayers;
wherein the reference layer has a sensitivity axis in the plane of the reference layer, such that the first and second reference magnetizations are switchable along the sensitivity axis between a first switching direction and a second switching direction opposed to the first switching direction; and
wherein the magnetic sensor element further comprises a SOT electrode, in direct contact with the first reference sublayer and configured to pass a SOT current adapted to switch the first reference magnetization by a spin orbit torque (SOT) interaction in the first or second switching direction, depending on the polarization of the SOT current;
wherein the sensing device further comprises a controller comprising a SOT line driver configured to control the passing of the SOT current in the SOT electrode of each of said at least one sensing branch; and
a reading circuit configured to control the passing of a read current through the MTJ of each of the sensing branches,
wherein each magnetic sensor element comprises a first and second MTJ, the first MTJ being connected via the capping electrode layer to a first capping terminal and the second MTJ being connected via the capping electrode layer to a second capping terminal,
wherein one SOT is connected at both ends of each of the sensing branches via an anti-parallel diode pair, such as to prevent the read current from passing from the SOT electrode of a sensing branch to the SOT electrode of another sensing branch.

2. The sensing device according to claim 1,
wherein each first MTJ in a sensing branch is connected in series with an adjacent second MTJ in the same sensing branch via the SOT electrode; and
wherein the second MTJs in a sensing branch are connected in series with the first MTJs in an adjacent sensing branch via a read current line.

3. The sensing device according to claim 1,
wherein the SOT line driver is configured to be galvanically insulated from the SOT electrode during the passing of a read current through said at least a MTJ.

4. The sensing device according to claim 1,
wherein each magnetic sensor element comprises one MTJ connected to a third capping terminal via the capping electrode layer.

5. The sensing device according to claim 4,
wherein the plurality of sensing branches are connected at both ends to a first and second terminal, the SOT line driver being connected to one of the first or second terminal such as to control the passing of the SOT current in the SOT electrode of each sensing branch.

6. The sensing device according to claim 4,
wherein the reading circuit is configured to control the passing of a read current through the MTJ.

7. The sensing device according to claim 1, wherein the reading circuit is configured to control the passing of a first read current through the first MTJ, and the passing of a second read current through the second MTJ.

8. The sensing device according to claim 4,
comprising a plurality of SOT line drivers; and
wherein each sensing branch is connected to one the SOT line drivers, each SOT line driver being configured to control the passing of the SOT current in the SOT electrode of the sensing branch to which it is connected.

9. The sensing device according to claim 4,
wherein each MTJ in a sensing branch is connected in series with one of the MTJs in an adjacent sensing branch via a read current line.

10. A sensing operation using a sensing device comprising:
at least one sensing branch comprising at least one magnetic sensor element, comprising:
at least one MTJ comprising, in this order, a reference layer, a tunnel barrier layer, a sense layer, and a capping electrode layer;
wherein the sense layer has a sense magnetization that is freely orientable in the presence of the external magnetic field in the plane of the sense layer;
wherein the reference layer comprises a reference SAF structure including a first reference sublayer, having a first reference magnetization, a second reference sublayer having a second reference magnetization and separated from the first reference sublayer by a coupling layer antiferromagnetically coupling the first and second reference sublayers;
wherein the reference layer has a sensitivity axis in the plane of the reference layer, such that the first and second reference magnetizations are switchable along the sensitivity axis between a first switching direction and a second switching direction opposed to the first switching direction; and
wherein the magnetic sensor element further comprises a SOT electrode, in direct contact with the first reference sublayer and configured to pass a SOT current adapted to switch the first reference magnetization by a spin orbit torque (SOT) interaction in the first or second switching direction, depending on the polarization of the SOT current;
wherein the sensing device further comprises a controller comprising a SOT line driver configured to control the passing of the SOT current in the SOT electrode of each of said at least one sensing branch; and
a reading circuit configured to control the passing of a read current through the MTJ of each of said at least one sensing branch;
wherein the sensing operation comprises the steps of:
controlling the SOT line driver to perform at least one switching cycle comprising passing the SOT current in the SOT electrode with a first direction to switch the first reference magnetization in a first switching direction and passing the SOT current in the SOT electrode with a second direction to switch the first reference magnetization in a second switching direction opposed to the first switching direction;

for each switching cycle, controlling the reading circuit to pass a read current through the MTJ when the first reference magnetization is in the first switching direction and measure a first resistance of the MTJ, and to pass a read current through the MTJ when the first reference magnetization is in the second switching direction and measure a second resistance of the MTJ; and for each switching cycle, determining a differential resistance from the difference between the first and second resistances.

11. The sensing operation according to claim 10, wherein said controlling the SOT line driver comprises passing a DC SOT current or a pulsed SOT current.

12. The sensing operation according to claim 10, comprising galvanically insulating the SOT line driver from the SOT electrode during said controlling the reading circuit.

13. The sensing operation according to claim 10, comprising a plurality of switching cycles and comprising a step of averaging the determined differential resistance over the plurality of switching cycles.

\* \* \* \* \*